United States Patent
Monkman et al.

(10) Patent No.: US 11,500,298 B2
(45) Date of Patent: Nov. 15, 2022

(54) RETICLE SUB-FIELD THERMAL CONTROL

(71) Applicant: ASML Holding N.V., Veldhoven (NL)

(72) Inventors: Eric Justin Monkman, Fairfield, CT (US); Michael Andrew Chieda, Easton, CT (US); Stephen Roux, New Fairfield, CT (US); Victor Antonio Perez-Falcon, Bridgeport, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 17/415,715

(22) PCT Filed: Dec. 12, 2019

(86) PCT No.: PCT/EP2019/084848
§ 371 (c)(1),
(2) Date: Jun. 17, 2021

(87) PCT Pub. No.: WO2020/126807
PCT Pub. Date: Jun. 25, 2020

(65) Prior Publication Data
US 2022/0057723 A1 Feb. 24, 2022

Related U.S. Application Data
(60) Provisional application No. 62/783,884, filed on Dec. 21, 2018.

(51) Int. Cl.
*G03F 7/20* (2006.01)
(52) U.S. Cl.
CPC .......... *G03F 7/70875* (2013.01); *G03F 7/707* (2013.01)

(58) Field of Classification Search
CPC .................... G03F 7/70875; G03F 7/707
See application file for complete search history.

(56) References Cited

U.S. PATENT DOCUMENTS 7,088,431 B2 * 8/2006 Ottens ............... G03F 7/707
355/75
8,705,008 B2 * 4/2014 Shibazaki ........... G03F 7/70716
355/72

(Continued)

FOREIGN PATENT DOCUMENTS

WO   WO 2008/112673 A2   9/2008

OTHER PUBLICATIONS

International Search Report and Written Opinion of the International Searching Authority directed to related International Patent Application No. PCT/EP2019/084848, dated Mar. 30, 2020; 8 pages.

(Continued)

*Primary Examiner* — Hung V Nguyen
(74) *Attorney, Agent, or Firm* — Sterne, Kessler, Goldstein & Fox P.L.L.C.

(57) ABSTRACT

An apparatus for reticle sub-field thermal control in a lithography system is disclosed. The apparatus includes a clamp configured to fix an object. The clamp includes a plurality of gas distribution features that are spatially arranged in a pattern. The apparatus further includes a gas pressure controller configured to individually control a gas flow rate through each of the plurality of gas distribution features to spatially modulate a gas pressure distribution in a space between the clamp and the object. The gas distribution features include a plurality of trenches or holes arranged in an array form.

20 Claims, 15 Drawing Sheets

(56) References Cited

U.S. PATENT DOCUMENTS

| | | |
|---|---|---|
| 11,081,383 B2 * | 8/2021 | Wu ................... H01L 21/6838 |
| 2012/0026474 A1 | 2/2012 | Nayfeh |
| 2013/0094005 A1 | 4/2013 | Kunnen et al. |
| 2015/0070665 A1 | 3/2015 | Chang |
| 2018/0213608 A1 | 7/2018 | Benjaminson et al. |
| 2018/0284627 A1 | 10/2018 | Kunnen et al. |

OTHER PUBLICATIONS

International Preliminary Report on Patentability directed to related International Patent Application No. PCT/EP2019/084848, dated Jun. 16, 2021; 6 pages.

* cited by examiner

RETICLE SUB-FIELD THERMAL CONTROL

CROSS-REFERENCE TO RELATED APPLICATIONS

This application claims priority of U.S. Provisional Patent Application No. 62/783,884, which was filed on Dec. 21, 2018, and which is incorporated herein in its entirety by reference.

FIELD

The present disclosure relates to reticle sub-field thermal control in lithography apparatuses and systems.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

As double patterning techniques are widely used to break through the lithographic printing limits to increase scanning speed and acceleration, reducing overlay errors becomes increasingly important. One important overlay error contributor is reticle heating. During a reticle sub-field exposure process, the heat load on the reticle is highly non-uniform. As a result, a conventional uniform reticle backside cooling system can result in "over-cooling" the unused areas of the reticle, leading to temperature non-uniformities that deform the reticle and increase overlay. There is a need to provide the reticle clamp with the capability to selectively control the temperature of a sub-field of the reticle.

SUMMARY

One aspect of the present disclosure provides an apparatus. The apparatus includes a clamp configured to fix an object. The clamp includes a plurality of gas distribution features that are spatially arranged in a pattern. The apparatus further includes a gas pressure controller configured to individually control a gas flow rate through each of the plurality of gas distribution features to spatially modulate a gas pressure distribution in a space between the clamp and the object. In some embodiments, the gas distribution features include a plurality of trenches or holes arranged in an array form.

In some embodiments, the gas distribution features are a plurality of trenches arranged in a patterned array of columns and rows. The trenches in odd numbers of rows or in even numbers of columns are extended along a row direction, and the trenches in even numbers of rows or in odd numbers of columns are extended along a column direction.

In some embodiments, the apparatus further includes a plurality of gas ducts configured to connect the gas distribution features to a gas supply system and a vacuum system, and a plurality of valves each configured to control a gas flow rate through a corresponding gas distribution feature. In some embodiments, the plurality of valves are Piezo valves or micro-electro-mechanical system valves.

In some embodiments, the gas pressure controller is further configured to generate standing gas pressure waves in a subset of the plurality of gas ducts to further spatially modulate the gas pressure distribution in the space between the clamp and the object.

In some embodiments, the apparatus further includes a plurality of fluid channels embedded in the clamp and arranged in a patterned array. Each fluid channel forms a sub-circuit configured to pass a fluid flow to locally control a temperature of a corresponding region of the clamp. In some embodiments, the apparatus further includes a temperature controller configured to individually control a temperature and a fluid flow rate of the fluid flow passing through each sub-circuit, thereby modulating a spatial temperature distribution of the clamp.

In some embodiments, the apparatus further includes a plurality of thermoelectric devices embedded in the clamp and arranged in an array form. Each of the plurality of thermoelectric devices is configured to locally control a temperature of a corresponding region of the clamp. In some embodiments, the plurality of thermoelectric devices include Peltier devices, thermionic cooling devices, or thermotunnel cooling devices. In some embodiments, the apparatus further includes a temperature controller configured to individually control an intensity of an electric current through each thermoelectric device, thereby modulating a spatial temperature distribution of the clamp.

In some embodiments, the apparatus further includes a plurality of heating wires embedded in the clamp and arranged in a patterned array. Each heating wire forms a sub-circuit configured to locally heat a corresponding region of the clamp. In some embodiments, the apparatus further includes a temperature controller configured to individually control an intensity of an electric current through each sub-circuit, thereby modulating a spatial temperature distribution of the clamp.

In some embodiments, the apparatus further includes a plurality of inductive heaters embedded in the clamp and arranged in a patterned array. Each inductive heater is configured to locally heat a corresponding region of the clamp. In some embodiments, the apparatus further includes a temperature controller configured to individually control an intensity of a magnetic field corresponding to each inductive heater, thereby modulating a spatial temperature distribution of the clamp.

In some embodiments, the apparatus further includes a plurality of infrared heaters each configured to emit an infrared beam to a sub-field of a frontside of the object to locally heat the sub-field of the object. In some embodiments, the apparatus further includes a temperature controller configured to individually control a position of each infrared heater, and an intensity and a direction of the infrared beam emitted from each infrared heater, thereby modulating a spatial temperature distribution of the object. In some embodiments, the apparatus further includes an infrared light absorb layer on the frontside of the object.

In some embodiments, the apparatus further includes a plurality of electrodes embedded in the clamp and arranged in a patterned array. Each electrode is configured to act as a radiofrequency antenna to locally heat a corresponding region of the object. In some embodiments, the apparatus further includes a temperature controller configured to individually generate a high frequency electrical signal that is superimposed onto a low-frequency electrostatic voltage on each electrode, thereby modulating a spatial temperature distribution of the object.

In some embodiments, the object is a reticle or a mask. A sub-field of the object is exposed under a lithography radiation beam, resulting in a spatial non-uniform heat load distribution on the object. In some embodiments, the apparatus further includes a temperature sensor array configured to remotely detect a spatial temperature distribution on the object.

Another aspect of the present disclosure provides a method for modulating a spatial temperature distribution of an object fixed on a clamp. The method includes determining a spatial non-uniform heat load distribution on the object, and modulating a spatial gas pressure distribution in a space between the object and the clamp based on the spatial non-uniform heat load distribution.

In some embodiments, the method further includes determining a spatial variation of coefficient of thermal expansion (CTE) temperature of zero-crossing (TZC) of the object, and modulating a spatial gas pressure distribution in a space between the object and the clamp based on the spatial variation of CTE TZC.

In some embodiments, the determining the spatial non-uniform heat load distribution on the object includes determining a first sub-field of the object that is exposed under a lithography radiation beam, and a second sub-field of the object that is unexposed from the lithography radiation beam. In some embodiments, the determining the spatial non-uniform heat load distribution on the object includes using a temperature sensor array to remotely detect a spatial temperature distribution on the object.

In some embodiments, the modulating the spatial gas pressure distribution includes generating a high gas flow rate in a first subset of a plurality of gas distribution features in the clamp corresponding to the first sub-field of the object to form a high gas pressure corresponding to the first sub-field is high, and generating a low gas flow rate in a second subset of the plurality of gas distribution features in the clamp corresponding to the second sub-field of the object to form a low gas pressure corresponding to the second sub-field.

In some embodiments, the modulating the spatial gas pressure distribution further includes generating a negative gas flow rate in a third subset of the plurality of gas distribution features in the clamp corresponding to a boundary of the first sub-field and the second sub-field of the object to form a sharp gas pressure transition corresponding to the boundary. In some embodiments, the modulating the spatial gas pressure distribution further includes generating a standing gas pressure wave in at least one gas duct connected to the first subset of a plurality of gas distribution features.

In some embodiments, the method further includes modulating a spatial heat flux distribution to the object based on the spatial non-uniform heat load distribution.

In some embodiments, the modulating the spatial heat flux distribution comprises individually controlling a temperature and a fluid flow rate of a fluid flow passing through each of a plurality of sub-circuits of fluid channels embedded in the clamp to modulate a spatial temperature distribution of the clamp. The plurality of sub-circuits of fluid channels are arranged in a patterned array.

In some embodiments, modulating the spatial heat flux distribution includes individually controlling an intensity of an electric current through each of a plurality of thermoelectric devices to modulate a spatial temperature distribution of the clamp. The plurality of thermoelectric devices are arranged in a patterned array.

In some embodiments, the modulating the spatial heat flux distribution comprises individually controlling an intensity of an electric current through each of a plurality of sub-circuits of heating wires embedded in the clamp to modulate a spatial temperature distribution of the clamp. The plurality of sub-circuits of heating wires are arranged in a patterned array.

In some embodiments, the modulating the spatial heat flux distribution comprises individually controlling an intensity of a magnetic field corresponding to each of a plurality of inductive heaters to modulate a spatial temperature distribution of the clamp. The plurality of inductive heaters are arranged in a patterned array.

In some embodiments, the modulating the spatial heat flux distribution comprises individually controlling a radiation position and an intensity of an infrared beam emitted from each of a plurality of infrared heaters on a frontside of the object to modulate a spatial temperature distribution of the object.

In some embodiments, the modulating the spatial heat flux distribution comprises individually controlling each of a plurality of electrodes embedded in the clamp to act as a radiofrequency antenna to modulate a spatial temperature distribution of the object. The plurality of electrodes are arranged in a patterned array. In some embodiments, the method further includes generating a high frequency electrical signal that is superimposed onto a low-frequency electrostatic voltage on each of the plurality of electrodes.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. Embodiments of the invention will now be described, by way of example only, with reference to the accompanying schematic drawings, in which.

Figure 5A:
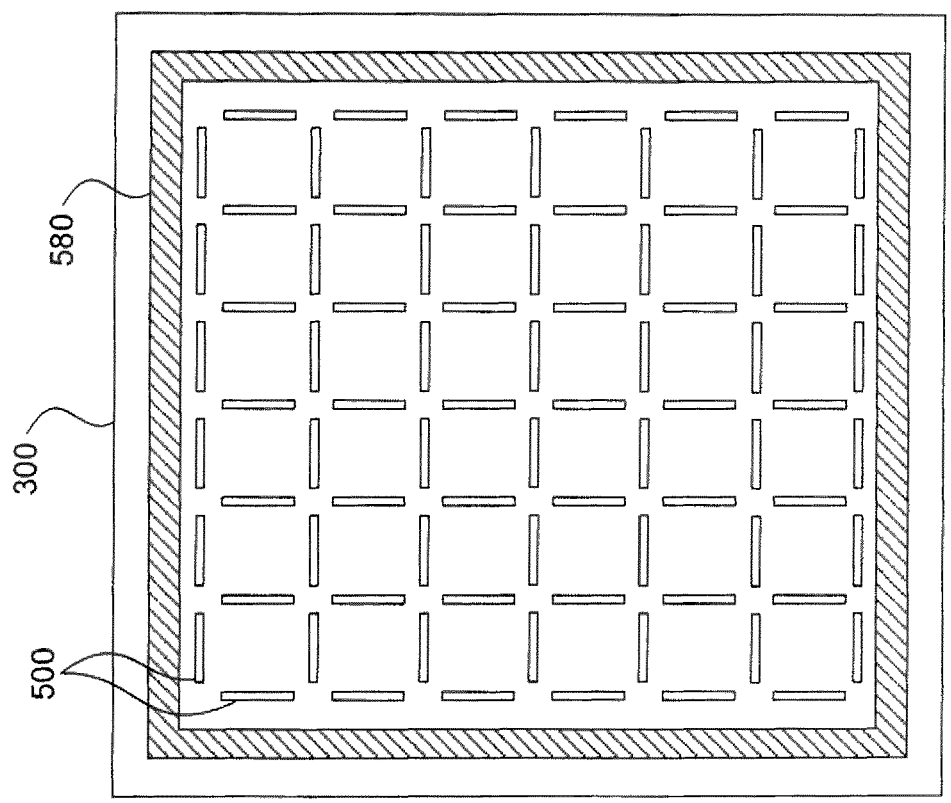
Figure 5B:
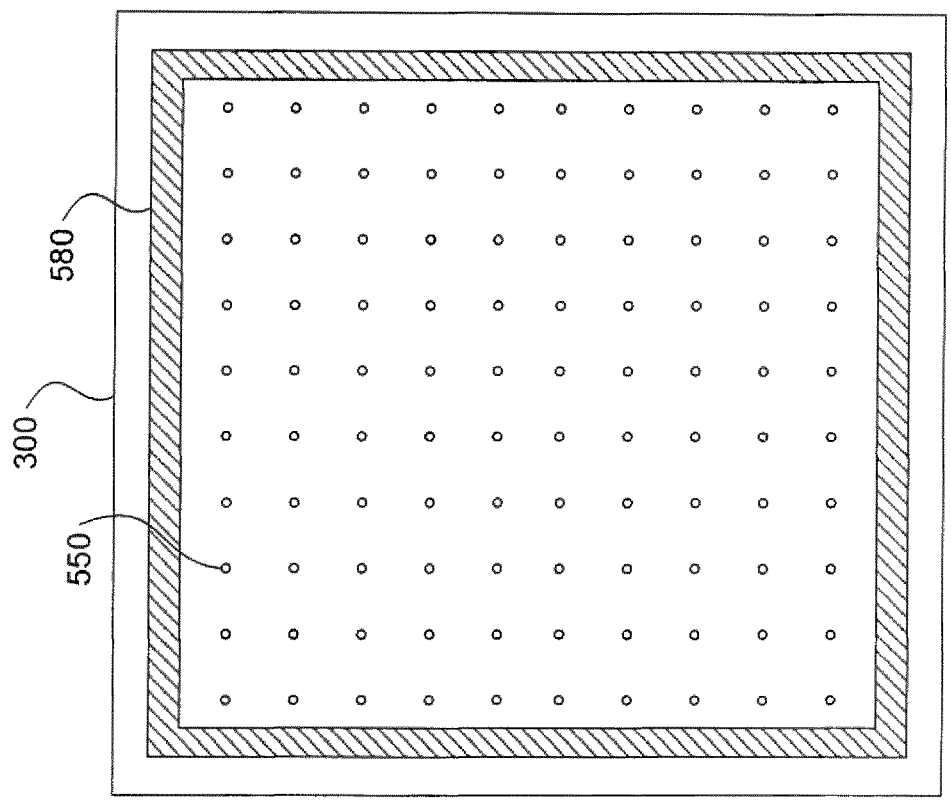
Figure 6:
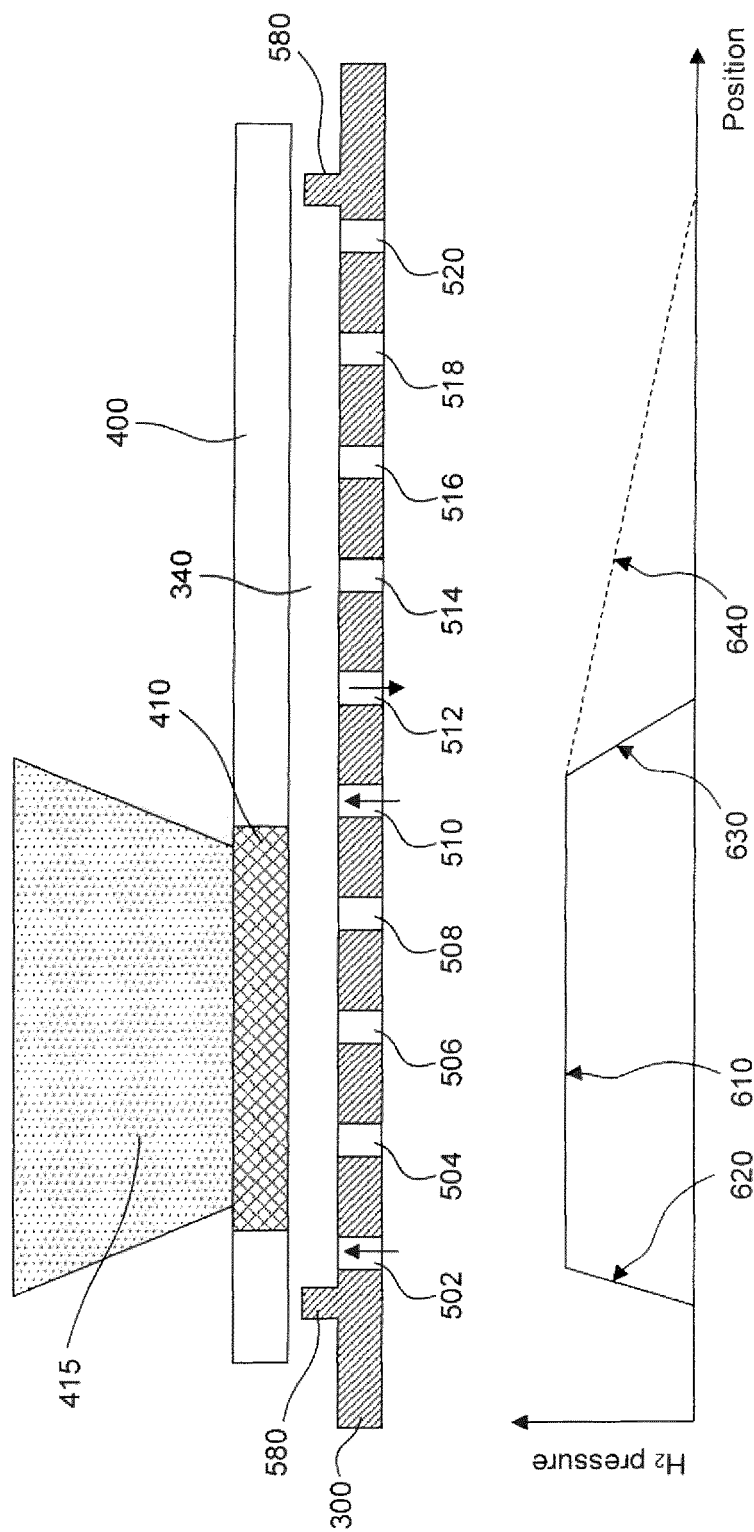
Figure 7:
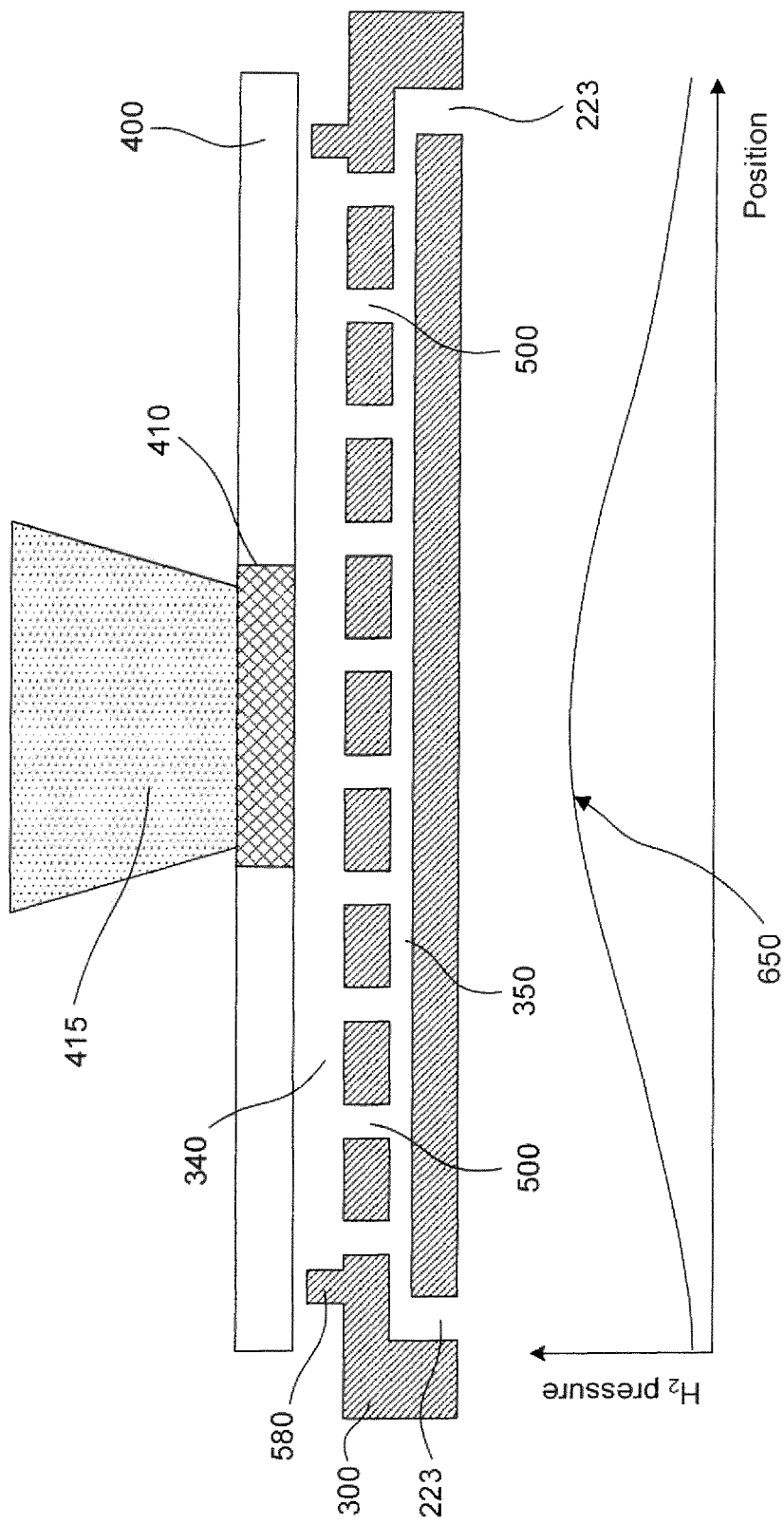
Figure 8:
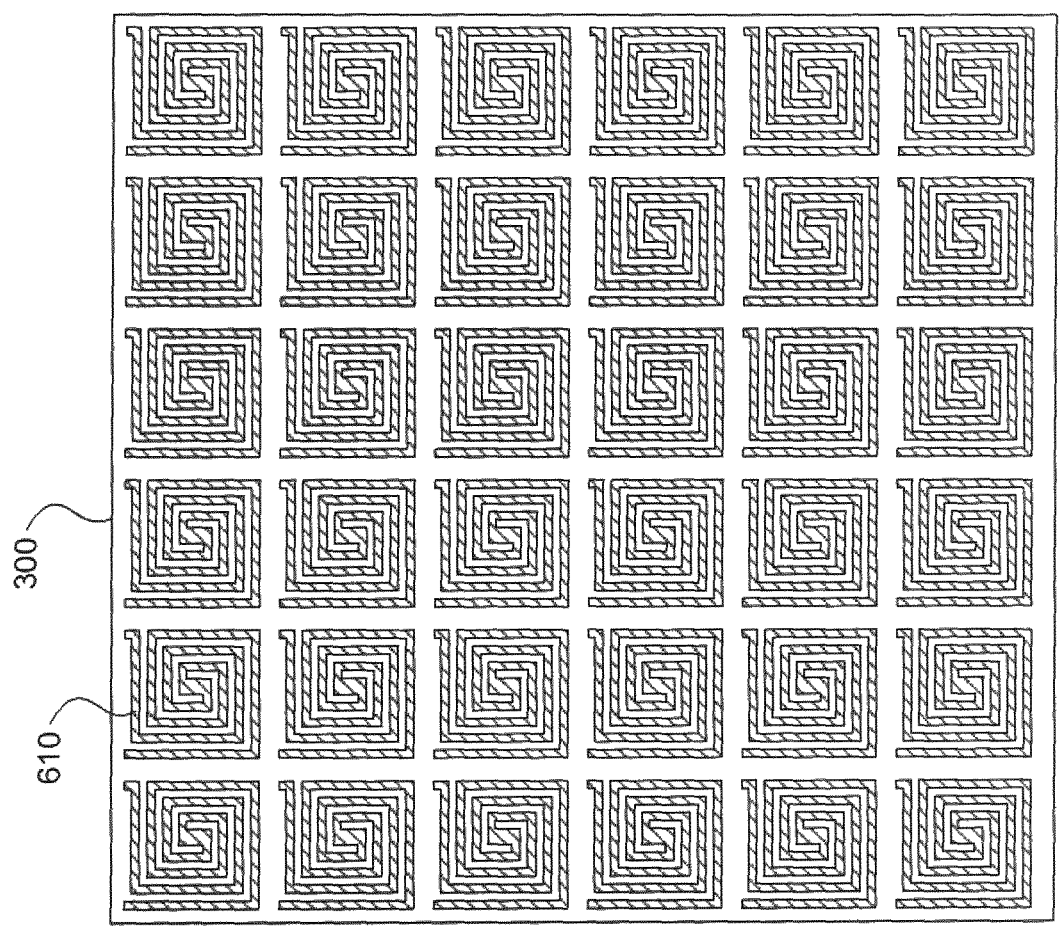
Figure 9:
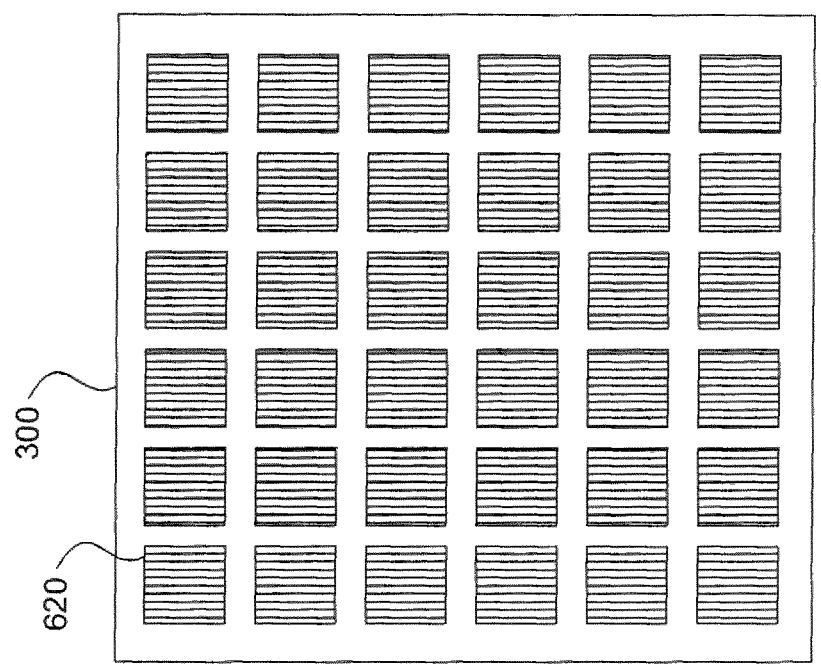
Figure 10:
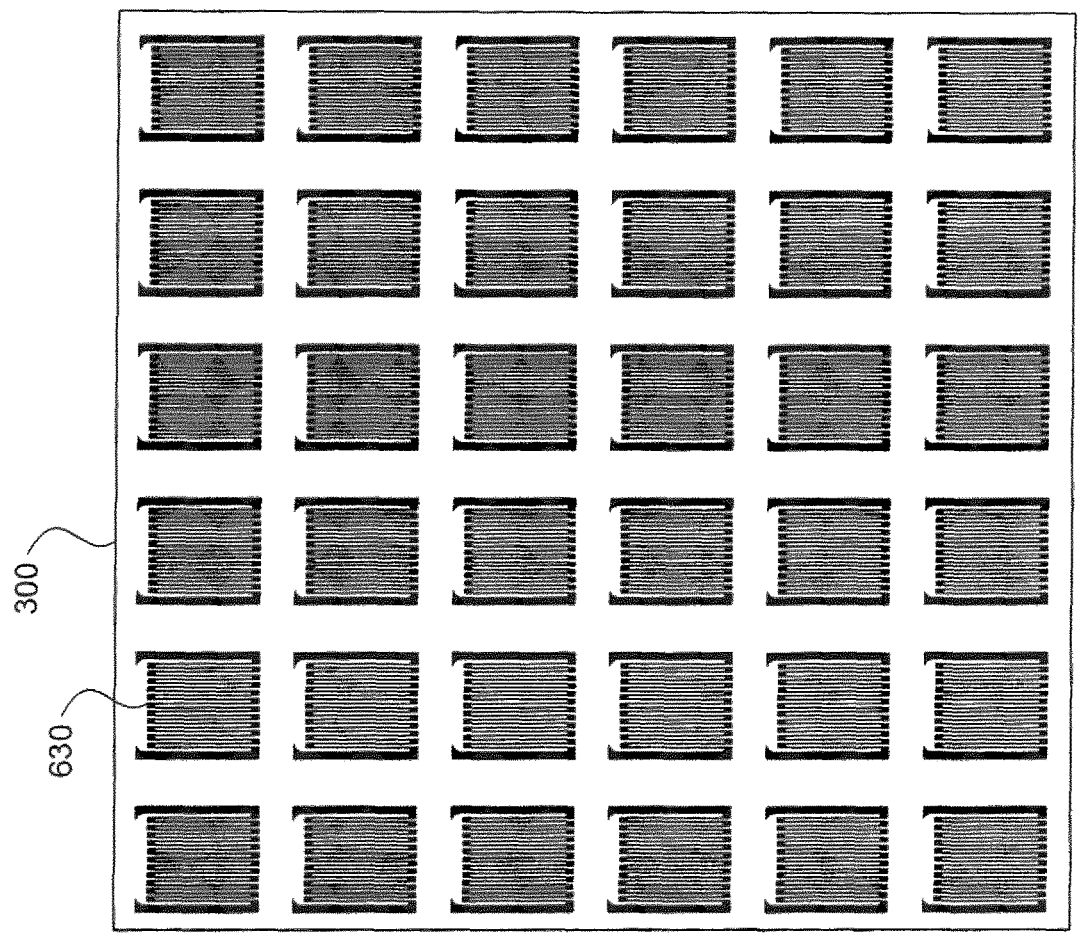
Figure 11:
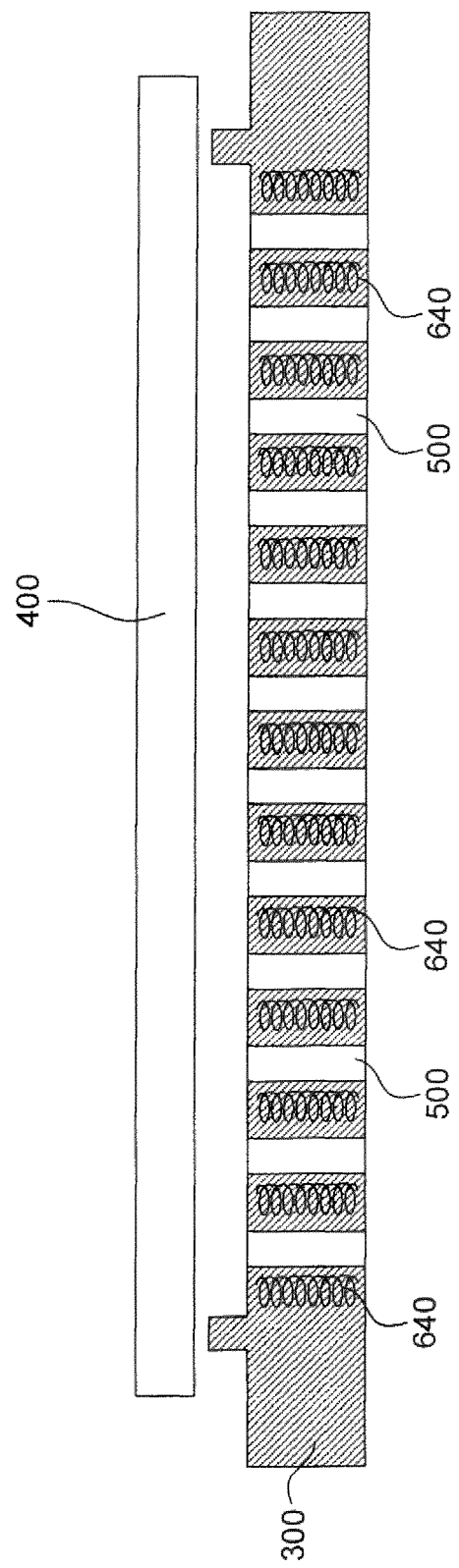
Figure 12:
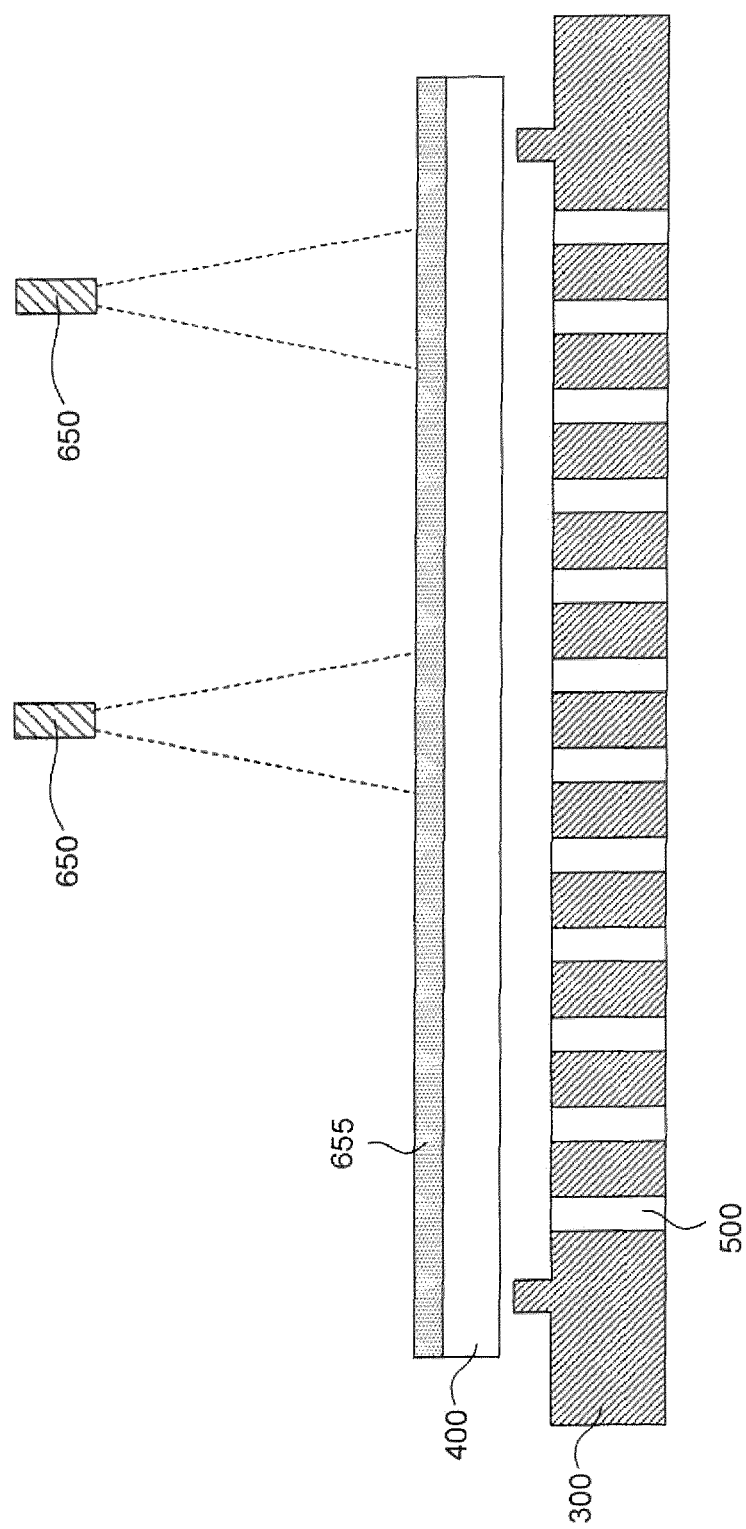
Figure 13:
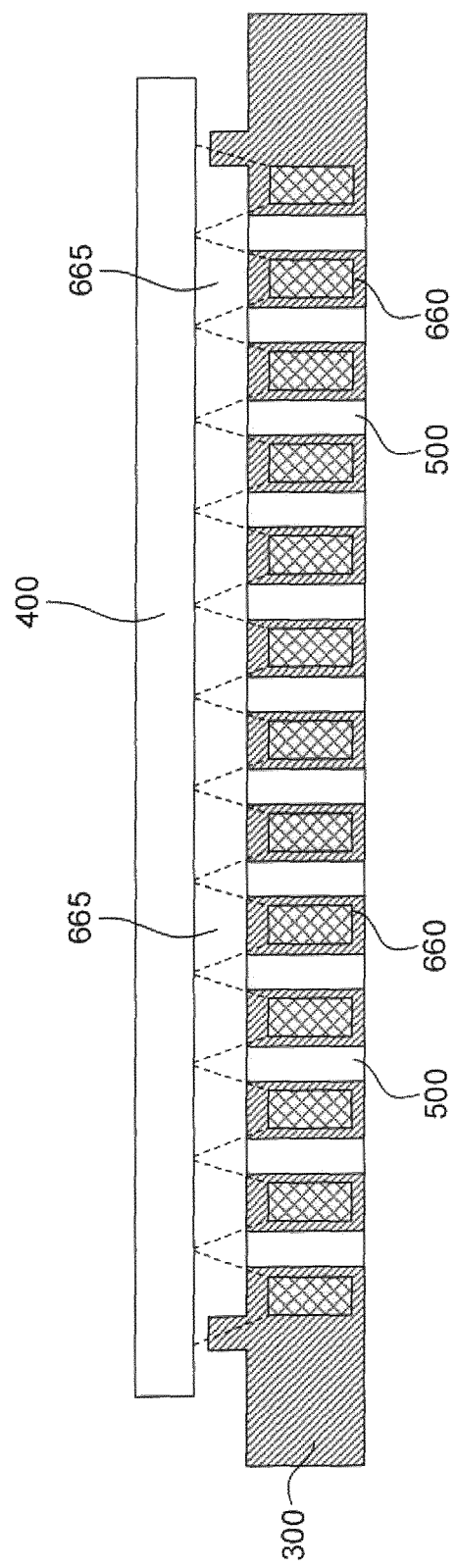
Figure 14:
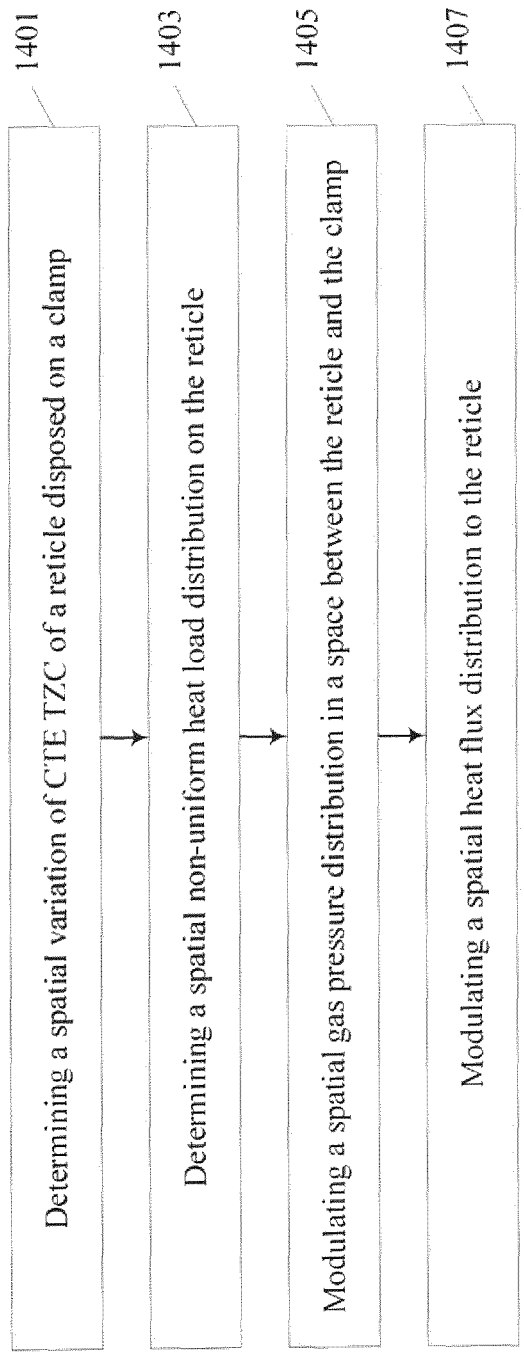

FIGS. 4A-4E illustrated schematic diagrams of exemplary various sub-fields in a reticle that are exposed to a lithotherapy radiation beam, according to an exemplary embodiment;

FIG. 5A is a top schematic illustration of a clamp including a plurality of trenches arranged in a patterned array, according to an exemplary embodiment;

FIG. 5B is a top schematic illustration of a clamp including a plurality of holes arranged in an array, according to an exemplary embodiment;

FIG. 6 illustrates a schematic cross-sectional diagram of a reticle on a clamp in a sub-field exposition, and a schematic diagram of a gas pressure distribution, according to some embodiments;

FIG. 7 illustrates a schematic cross-sectional diagram of a reticle on a clamp in a sub-field exposition, and a schematic diagram of a gas standing pressure wave, according to some embodiments;

FIG. 8 illustrates a schematic top view diagram of an exemplary clamp including a plurality of inner fluid channels, according to some embodiments of the present disclosure;

FIG. 9 illustrates a schematic top view diagram of an exemplary clamp including a plurality of thermoelectric devices, according to some embodiments of the present disclosure;

FIG. 10 illustrates a schematic top view diagram of an exemplary clamp including a plurality of heating wires, according to some embodiments of the present disclosure;

FIG. 11 illustrates a schematic side view diagram of an exemplary clamp including a plurality of inductive heaters, according to some embodiments of the present disclosure;

FIG. 12 illustrates a schematic side view diagram of exemplary infrared heaters and a reticle, according to some embodiments of the present disclosure;

FIG. 13 illustrates a schematic cross-sectional view diagram of an exemplary clamp including a plurality of electrodes that emit RF radiation, according to some embodiments of the present disclosure;

FIG. 14 illustrates a schematic diagram of an exemplary method for controlling a spatial temperature distribution of a reticle in accordance with some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc., and in doing that may cause actuators or other devices to interact with the physical world.

Before describing such embodiments in more detail, however, it is instructive to present an example environment in which embodiments of the present disclosure may be implemented.

Exemplary Lithographic System

Figure 1:
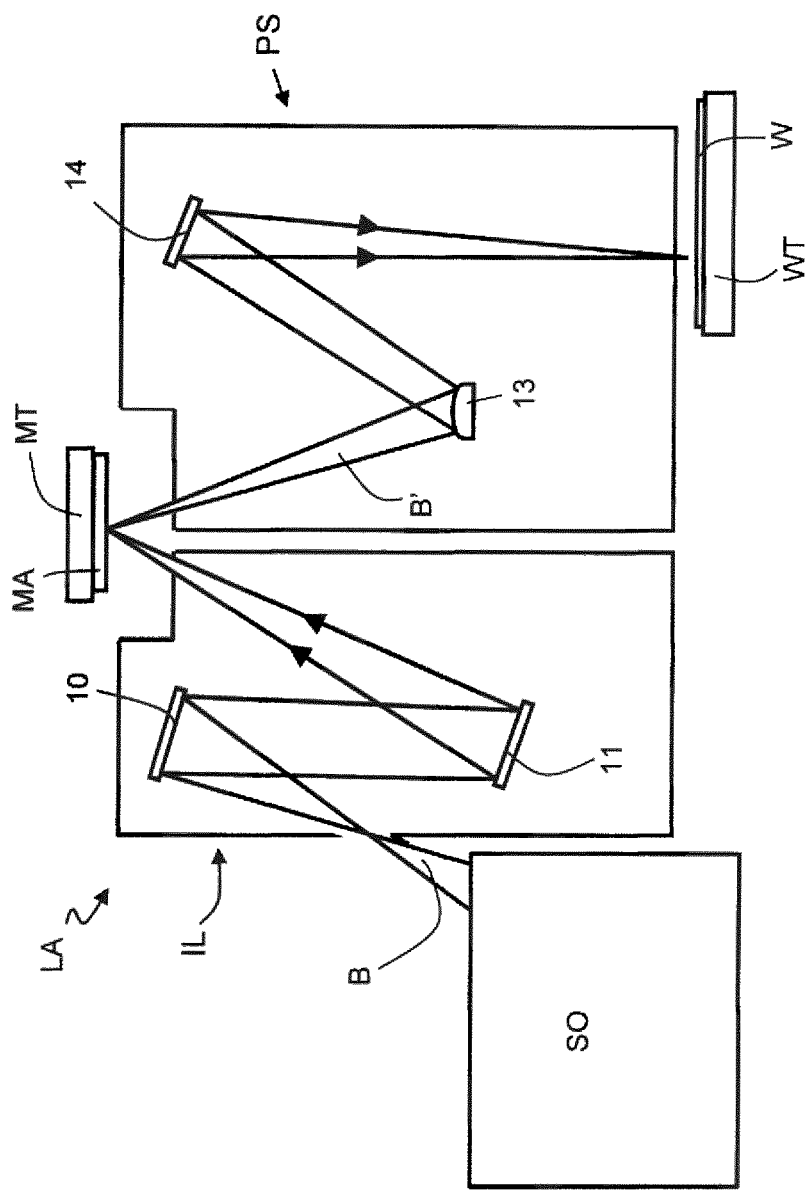
FIG. 1 is a schematic illustration of a lithographic apparatus, according to an exemplary embodiment.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS, and a substrate table WT configured to support a substrate W.

The illumination system IL is configured to condition the EUV radiation beam B before the EUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL), or any other radiation source that is capable of generating EUV radiation.

Exemplary Reticle Stage

Figure 2:
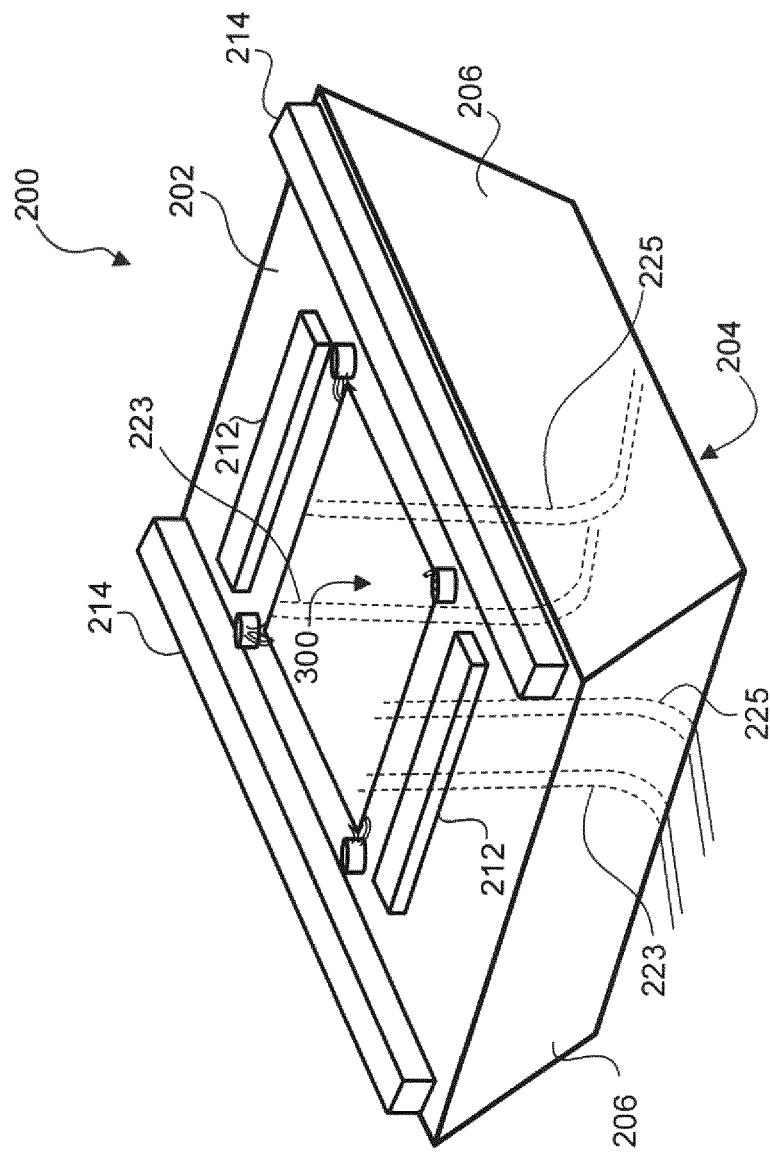
FIG. 2 is a perspective schematic illustration of a reticle stage chuck, according to an exemplary embodiment.
Figure 3:
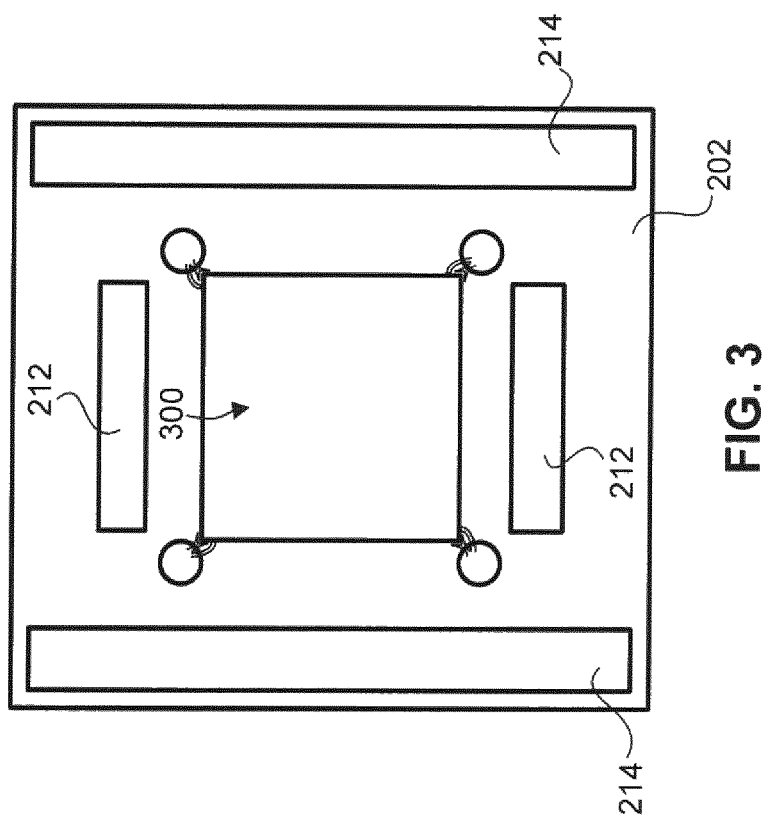
FIG. 3 is a top plan view of the reticle stage chuck of FIG. 2.
Figure 4A:
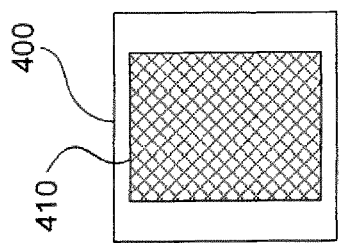
Figure 4B:
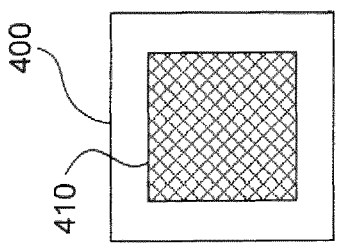
Figure 4C:
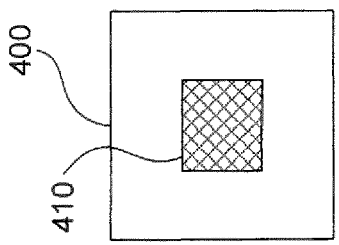
Figure 4D:
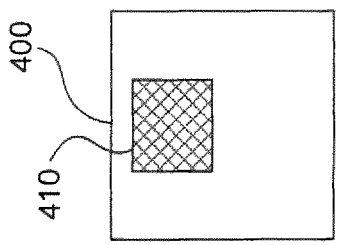
Figure 4E:
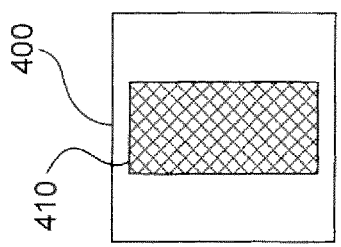

FIGS. 2 and 3 show schematic illustrations of an exemplary reticle stage chuck 200, according to some embodiments of this disclosure. Reticle stage chuck 200, as an example of support structure MT, can include top stage surface 202, bottom stage surface 204, side stage surfaces 206, and clamp 300. In some embodiments, reticle stage chuck 200 with clamp 300 can be implemented in lithographic apparatus LA. For example, reticle stage chuck 200 can be support structure MT in lithographic apparatus LA. In some embodiments, clamp 300 can be disposed on top stage surface 202. For example, as shown in FIG. 2, clamp 300 can be disposed at a center of top stage surface 202.

In some lithographic apparatuses, for example, lithographic apparatus LA, a reticle stage chuck 200 with a clamp 300 can be used to hold and position a reticle W for scanning or patterning operations. In one example, the reticle stage chuck 200 may require powerful drives, large balance masses, and heavy frames to support it. In one example, the reticle stage chuck 200 may have a large inertia and can weigh over 500 kg to propel and position a reticle W weighing about 0.5 kg. To accomplish reciprocating motions of the reticle W, which are typically found in lithographic scanning or patterning operations, accelerating and decelerating forces can be provided by linear motors that drive the reticle stage chuck 200.

In some embodiments, as shown in FIGS. 2 and 3, reticle stage chuck 200 can include fiducial 212 for system calibration operations and encoder 214 for positioning operations. For example, encoder, 214 can be glass scales for interferometers. Fiducial 212 can be attached along a first direction, for example, a transverse direction (i.e., X-direction) of reticle stage chuck 200. And encoder 214 can be attached along a second direction, for example, a longitudinal direction (i.e., Y-direction) of reticle stage chuck 200. In some embodiments, as shown in FIGS. 2 and 3, fiducial 212 can be orthogonal to encoder 214.

As shown in FIGS. 2 and 3, reticle stage chuck 200 can include clamp 300. Clamp 300 is configured to hold a reticle in a fixed plane on reticle stage chuck 200. Clamp 300 can be disposed on top stage surface 202. In some embodiments, clamp 300 can use mechanical, vacuum, electrostatic, or other suitable clamping techniques to hold and secure an object. The object can be, for example, a patterning device MA such as a mask or reticle.

In some embodiments, clamp 300 can be an electrostatic clamp, which can be configured to electrostatically clamp (i.e., hold) an object, for example, the reticle in a vacuum environment. Due to the requirement to perform EUV in a vacuum environment, vacuum clamps cannot be used to clamp a mask or reticle and instead electrostatic clamps can be used. For example, clamp 300 can include an electrode, a resistive layer on the electrode, a dielectric layer on the resistive layer, and burls projecting from the dielectric layer. In use, a voltage can be applied to clamp 300, for example, several kV. And current can flow through the resistive layer, such that the voltage at an upper surface of the resistive layer will substantially be the same as the voltage of the electrode and generate an electric field. Also, a Coulomb force, attractive force between electrically opposite charged particles, will attract an object to clamp 300 and hold the object in place. In some embodiments, clamp 300 can be a rigid material, for example, a metal, a dielectric, a ceramic, or a combination thereof.

Exemplary Reticle Temperature Conditioning System

Patterning device MA imparts a pattern onto EUV radiation beam B incident on a surface of patterning device MA. When the object (e.g., a reticle) is clamped to clamp 300, a surface of the object receives EUV radiation beam B. When the object is exposed with incident EUV radiation beam B, a portion of the object can absorb power from the radiation beam and heat up. When the object is heated, portions of the object can expand and deform, causing undesired distortion of patterned EUV radiation beam B', thereby resulting in image overlay errors at substrate W.

Thus, a temperature conditioning system can be configured to thermally condition the object to minimize overlay. In some embodiments, clamp 300 can be configured to act as a heat sink to be maintained at a temperature lower than the target average temperature of the object to accomplish this temperature control of the object. As such, the object clamped on reticle stage chuck 200 can be conditioned at substantially room temperature (for example, about 22° C.) or any other defined operating temperature, according to various embodiments.

In some embodiments, the heat load on the object clamped on reticle stage chuck 200 is non-uniform during sub-field exposures. As shown in FIGS. 4A-4E, exemplary sub-fields 410 in reticle 400 that are exposed to EUV radiation beam B can result in non-uniform temperature distributions of reticle 400. The conventional uniform reticle backside cooling method can cause over-cooling in the unexposed regions of reticle 400. That is, the temperatures of the unexposed regions of reticle 400 are not maintained at around temperature of zero crossover (TZC) which is the zero crossover of the coefficient of thermal expansion of the reticle, leading to temperature non-uniformities that deform the reticle and increase overlay. The disclosed temperature conditioning system can selectively control the temperature of a sub-field of reticle 400 to ensure a uniformly temperature distribution of reticle 400 clamped on reticle stage chuck 200.

In some embodiments, the temperature conditioning system can include a fluid flow temperature modulation subsystem. As shown in FIG. 2, reticle stage chuck 200 can include one or more fluid ducts 225 (i.e. water ducts) that are connected to one or more fluid supply device (not shown in the figures) of the lithographic apparatus LA. In some embodiments, fluid ducts 225 are fluid hoses. In some embodiments, reticle stage chuck 200 can further include one or more fluid duct carriers (not shown in the figures) that house and/or support fluid ducts 225. Further, clamp 300 includes a plurality of inner fluid channels that are connected to the one or more fluid ducts 225. Inner fluid channels can be configured for conducting a temperature conditioning fluid, such as water, alcohol, glycol, phase change coolant, etc., through a thermally well conducting region of clamp 300 to maintain clamp 300 at a temperature lower than the target temperature of object by passing a fluid conditioned to a target temperature through at least one channel defined by clamp. In some embodiments, the inner fluid channels can be configured to define various sub-fields of clamp 300 to spatially modulate the temperature distribution of reticle 400 on clamp 300.

In some embodiments, the direct thermal conductivity between reticle 400 and clamp 300 is poor due to a low contact area. To achieve a high thermal conductivity, the temperature conditioning system can further include a gas flow temperature modulation sub-system. As shown in FIG. 2, reticle stage chuck 200 can include one or more gas ducts 223 (i.e. hydrogen ducts) that are connected to one or more gas supply device (not shown in the figures) of the lithographic apparatus LA. In some embodiments, gas ducts 223 are gas hoses. In some embodiments, reticle stage chuck 200 can further include one or more gas duct carriers (not shown in the figures) that house and/or support gas ducts 223. Further, clamp 300 can include a plurality of gas trenches that are connected to the one or more gas ducts 223 to flow hydrogen ($H_2$) gas into the space between reticle 400 and clamp 300. In some embodiments, gas trenches and/or other gas distribution features can be configured to define varies sub-fields on reticle 400 that can be individually thermally controlled. Spatially modulating the gas (e.g., $H_2$) pressure in the space between reticle 400 and clamp 300 can be used to improve reticle thermal conditioning.

In some embodiments, the temperature conditioning system can further include any other suitable thermal modulation sub-system configured to modulate the temperature distribution on one or more sub-fields of clamp 300. For example, the thermal modulation sub-system can include multiple thermoelectric devices, such as Peltier devices, thermionic cooling devices, thermotunnel cooling devices that are embedded in clamp 300 to locally control varies sub-fields of clamp 300. As another example, the thermal modulation sub-system can include one or more heating devices, such as embedded heating wires, infrared heaters, radiofrequency radiation heaters, inductive heaters, etc., to selectively heat various sub-fields of clamp 300 to increase temperature uniformity of the reticle on clamp 300.

Exemplary Gas Pressure Modulations between Reticle and Clamp

As discussed above, reticle heating and the resulting in-plane and out-of-plane distortion of the reticle is a major contributor to overlay errors. Especially, during sub-field exposures, the heat load is non-uniform over the surface of the reticle and results in a non-uniform temperature distribution. In some embodiments, clamp 300 can include a plurality of gas distribution features, such as trenches and/or holes that are arranged in a pattern. The gas distribution features are configured to define varies sub-fields on reticle 400 that can be selectively thermally controlled. Spatially modulating the gas (e.g., $H_2$) pressure in the space between reticle 400 and clamp 300 can be used to improve reticle thermal conditioning. For example, FIGS. 5A and 5B illustrate schematic top view diagrams of exemplary clamps in accordance with some embodiments of the present disclosure.

In some embodiments, as shown in FIG. 5A, clamp 300 includes a plurality of trenches 500 arranged in an array form. The trenches 500 in odd numbers of rows are extended along the direction of the rows (e.g., X-direction as shown in FIG. 5A). The trenches 500 in even numbers of rows are extended along the direction perpendicular to the rows (e.g., Y-direction as shown in FIG. 5A). The trenches 500 in odd numbers of columns are extended along the direction of the columns (e.g., Y-direction as shown in FIG. 5A). The trenches 500 in even numbers of columns are extended along the direction perpendicular to the columns (e.g., X-direction as shown in FIG. 5A). As such, the plurality of trenches 500 can define a plurality of unit-fields each being surrounded by four trenches 500. In some embodiments, a first length of the trenches 500 extended along the direction of the rows is equal to a second length of the trenches 500 extended along the direction of the columns, each unit-field has a square shape. In some other embodiments, the first length of the trenches 500 extended along the direction of the rows is different from the second length of the trenches 500 extended along the direction of the columns, each unit-field has a rectangle shape.

In some other embodiments, as shown in FIG. 5B, clamp 300 include a plurality of holes 550 arranged in an array form. It is noted that, the shapes and/or sizes of trenches 500 and holes 550 as shown in FIGS. 5A and 5B are merely intended to be illustrative, but not limiting. Trenches 500 and holes 550 can have any suitable shapes and sizes designed based on actual needs. For example, trenches 500 can have a curved shape. It is also noted that, the patterns of trenches 500 and holes 550 as shown in FIGS. 5A and 5B are also illustrative, but not limiting. For example, trenches 500 and holes 550 can be arranged in any other suitable patterns that define various sub-fields on reticle 400. Further, in some other embodiments not shown in the figures, clamp 300 can simultaneously include a plurality of trenches 500 and holes 550 that are arranged in any suitable patterns to define various sub-fields on reticle 400.

Each trench 500 as shown in FIG. 5A or each hole 510 as shown in FIG. 5B can penetrate a top layer of clamp 300 and be interconnected to a corresponding gas duct 223 as shown in FIG. 2. Trenches 500 and/or holes 510 can be used as either gas inlets or gas outlets. In some embodiments, each trench 500 and/or each hole 510 can include a valve (not shown in figures) configured to control a gas flow going through. Any suitable types of valves, such as micro-electro-mechanical system (MEMS) valves, Piezo valves, gas pressure regulators, flow control valves, etc., can be used to directly or indirectly shut gas flow on/off, adjust the gas flow rate, and/or vent to vacuum in specific region between clamp 300 and reticle 400. For example, the valves can be open-closed, open-closed-vacuum, or a variable flow restriction. In some embodiments, to achieve vacuum, the valves can vent to a vacuum line, or directly into a chamber. In some alternative embodiments, the valves are not disposed in trenches 500 and/or holes 510, but are disposed in gas ducts 223 to respectively control the gas flow rate of trenches 500 and/or holes 510.

Based on controlling the valves, different gas flow rates can be achieved over the various gas distribution features (e.g., trenches 500, holes 550). This can modulate the gas pressure distribution in space 340 between clamp 300 and reticle 400 to locally control the thermal conductivity in different sub-fields. FIG. 6 illustrates a schematic cross-sectional diagram of a reticle on a clamp in a sub-field exposure, and a schematic diagram of a gas pressure distribution, according to some embodiments.

As shown in FIG. 6, sub-field 410 of reticle 400 is exposed under EUV radiation beam 415 resulting in a heat load in sub-field 410 higher than other regions of reticle 300. In order to maintain a uniform temperature distribution in reticle 400, a relatively large cooling efficiency on sub-field 410 and a relatively small cooling efficiency on other regions of reticle 400 can be required. The valves corresponding to trenches 502, 504, 506, 508 and 510 that are located below sub-field 410 can be controlled to inject a gas (e.g., $H_2$) into space 340 between clamp 300 and reticle 400, such that the region of space 340 below sub-field 410 can have a high gas pressure 610. In some embodiments, the gas flow rates of trenches 502, 504, 506, 508 and 510 can be controlled equal or different to ensure an even high gas pressure 610 that results in an evenly distributed high thermal conductivity corresponding to sub-field 410. The valves corresponding to trenches 512, 514, 516, 518 and 520 can be closed to gradually decrease the gas pressure, as shown in dashed line 640 in FIG. 6.

In some embodiments, the gas pressure in space 340 at the boundary sub-field 410 and other regions of reticle 400 can be further modulated. For example, some gas distribution features, such as trench 512 as shown in FIG. 6, can remove gas from space 340 by pumping out the gas. As such, the gas pressure at trench 512 can rapidly drop to near-zero when trench 512 is used as a pump, resulting a sharp transition 630 from regions of high gas pressure to regions of low gas pressure.

Another example, as shown in FIGS. 5A, 5B and 6, reticle 400 can include one or more dams 580 disposed at an edge of the plurality of trenches 500 and/or holes 550. The one or more dams 580 can be flow obstructions, leaky seals, etc., configured to rapidly drop the gas pressure to near-zero, resulting a sharp transition 620 of gas pressure distribution at edge of space 340. In some embodiments, when the distance between clamp 300 and reticle 400 is in a range from about 8 micrometers to about 12 micrometers, a height of dam 580 can be in a range from about 2 micrometers to about 3 micrometers. In some embodiments, additional dams can be disposed between adjacent trenches 500 and/or holes 550 to further define the boundaries of sub-fields.

FIG. 7 illustrates a schematic cross-sectional diagram of a reticle on a clamp in a sub-field exposition, and a schematic diagram of a gas standing pressure wave, according to some embodiments. In some embodiments, standing pressure waves can be generated in gas reservoir 350 and/or in gas ducts 223 that are connected to the gas distribution features on the clamp to setup a spatially modulated gas pressure distribution in space 340. The peak region of standing wave 650 can correspond to sub-field 410 of reticle 400 that is exposed under EUV radiation beam 415, and the valley region of standing wave 650 can correspond to unexposed regions of reticle 400. The standing pressure waves can be either one-dimensional spatially distributed waves or two-dimensional spatially distributed waves. The standing pressure waves can be actuated by a single or small number of actuators by controlling vibration frequency to setup standing pressure waves with various wavelengths. Trenches 500 and/or holes 550 leading up to the surface of clamp 300 can connect standing pressure waves to the gas pressure distribution in space 340 to further modulate the thermal conduction.

In some embodiments, the gas pressure distribution in space 340 varies in a range from about 3% atmospheric pressure to about 5% atmospheric pressure. It is noted that the variation of the gas pressure distribution does not cause a significant deformation of reticle 400 based on a material stiffness of reticle 400, thereby contributing insignificantly to overlay errors.

In some embodiments, the valves corresponding to the plurality of trenches 500 and/or holes 550 can be addressed and controlled by an electrical control module of the temperature conditioning system. The valves can be connected to the electrical control module by a plurality of power lines and data lines. In one embodiment, the number of hoses and wires connected to clamp 300 is minimized for performance of the reticle stage chuck 200, since wires and hoses can transmit forces to the clamp 300 which can result in position errors. For example, pair-wise matching of input and output lines can be used to address and/or control each of the plurality of valves corresponding to the trenches 500 and/or holes 550 with fewer input/output lines. As another example, time-dependent techniques, such as pulse width modulation, different resonant frequencies selection, etc., can be used to gain more addressable degrees of freedom with a smaller number of input/output lines.

Exemplary Spatial Heat Flux Modulation on Clamp or Reticles

As described above, in addition to the gas flow temperature modulation sub-system, the temperature conditioning system can further include any other suitable spatial heat flux modulation sub-systems to modulate the heat flux distribution on clamp 300 and/or reticle 400. FIGS. 7-12 illustrated schematic diagrams of various exemplary spatial heat flux modulation sub-systems in accordance with some embodiments of the present disclosure.

In some embodiments, the temperature conditioning system further includes a fluid flow temperature modulation sub-system. As shown in FIG. 8, a schematic top view diagram of an exemplary clamp including a plurality of inner fluid channels is illustrated, according to some embodiments of the present disclosure. Clamp 300 can include a plurality of inner fluid channels 610 embedded in clamp 300. In some embodiments, inner fluid channels 610 can be segmented into sub-circuits that are arranged in a patterned array and individually addressable. Each sub-circuit of inner fluid channels 610 can be configured to define a unit field of clamp 300 to locally modulate the temperature of the unit field of clamp 300.

In some embodiments, each sub-circuit of inner fluid channels 610 can be controlled using similar techniques as described above for gas valves. For example, multiple independent fluid duct 225 can be used to supply fluid flows with different temperatures to selected sub-circuit of inner fluid channels 610 respectively. As another example, a valve corresponding to each sub-circuit of inner fluid channels 610 can be independently controlled to restrict a fluid flow rate through the sub-circuit. As such, a desired temperature distribution over the surface of clamp 300 can be realized to spatially modulate the heat flux from clamp 300 to reticle 400.

It is noted that the number of sub-circuits of inner fluid channels 610, the sizes of inner fluid channels 610, the gaps between adjacent sub-circuits of inner fluid channels 610, the shape of each sub-circuit of inner fluid channels 610, and the patterned array of the plurality sub-circuits of inner fluid channels 610 that are shown in FIG. 8 are merely illustrative, but not limiting the scope of the present disclosure. Any suitable design of shape, size, pattern, and segment of inner fluid channels 610 that enable the fluid flow temperature modulation sub-system to spatially modulate the temperature distribution of clamp 300 can be applied. In some embodiments, trenches 500 and/or holes 550 can be disposed in an upper layer of clamp 300, and inner fluid channels 610 can be embedded in a lower layer of clamp 300. In some embodiments, trenches 500 and/or holes 550 can be disposed in gaps between adjacent sub-circuits of inner fluid channels 610.

In some embodiments, the temperature conditioning system further includes a thermoelectric temperature modulation sub-system. As shown in FIG. 9, a schematic top view diagram of an exemplary clamp including a plurality of thermoelectric devices is illustrated, according to some embodiments of the present disclosure. Clamp 300 can include a plurality of thermoelectric devices 620 embedded in clamp 300. In some embodiments, the plurality of thermoelectric devices 620 can be arranged in an array and individually addressable. Each thermoelectric device 620 can define a unit field of clamp 300 and configured to locally control the temperature of the corresponding unit field of clamp 300. For example, thermoelectric devices 620 can be Peltier devices configured to use Peltier effect to locally control the heat flow into and out of various sub-fields of reticle 400. As another example, thermoelectric devices 620 can be thermionic cooling devices or thermotunnel cooling devices that are embedded in clamp 300 to locally control the heat flow into and out of various sub-fields of reticle 400.

It is noted that the number of thermoelectric devices 620, the size of thermoelectric devices 620, the gaps between adjacent thermoelectric devices 620, the shape of thermoelectric devices 620, and the arrangement of the plurality thermoelectric devices 620 that are shown in FIG. 9 are merely illustrative, but not limiting the scope of the present disclosure. Any suitable design of shape, size, and arrangement of thermoelectric devices 620 that enable the thermoelectric temperature modulation sub-system to spatially modulate the temperature distribution of clamp 300 can be applied. In some embodiments, trenches 500 and/or holes 550 can be disposed in an upper layer of clamp 300, and thermoelectric devices 620 can be embedded in a lower layer of clamp 300. In some embodiments, trenches 500 and/or holes 550 can be disposed in gaps between adjacent thermoelectric devices 620.

In some embodiments, the temperature conditioning system further includes one or more heating devices configured to heat the portions of reticle 400 that receive less heat load from the lithography light beam or corresponding portions of clamp 300, such that the net heat load is spatially uniform on reticle 400. The one or more heating devices can include embedded heating wires, one or more infrared heaters, one or more radiofrequency radiation heaters, one or more inductive heaters, etc., to selectively heat various sub-fields of clamp 300 or reticle 400 to increase temperature uniformity of reticle 400.

As shown in FIG. 10, a schematic top view diagram of an exemplary clamp including a plurality of heating wires is illustrated, according to some embodiments of the present disclosure. Clamp 300 can include a plurality of heating wires 630 that are segmented into multiple sub-circuits arranged in a patterned array and individually addressable. Each sub-circuit of heating wires 630 can be configured to define a unit field of clamp 300 to locally heat the unit field of clamp 300. As such, a desired heat flux distribution from clamp 300 to reticle can be realized.

It is noted that, the number of sub-circuits of heating wires 630, the sizes of heating wires 630, the gaps between adjacent sub-circuits of heating wires 630, the shape of each sub-circuit of heating wires 630, and the patterned array of the plurality sub-circuits of heating wires 630 that are shown in FIG. 10 are merely illustrative, but not limiting the scope of the present disclosure. Any suitable design of shape, size, pattern, and segment of heating wires 630 that enable various sub-fields heat flux modulation can be applied. In some embodiments, trenches 500 and/or holes 550 can be disposed in an upper layer of clamp 300, and heating wires 630 can be embedded in a lower layer of clamp 300. In some embodiments, trenches 500 and/or holes 550 can be disposed in gaps between adjacent sub-circuits of heating wires 630.

As shown in FIG. 11, a schematic side view diagram of an exemplary clamp including a plurality of inductive heaters is illustrated, according to some embodiments of the present disclosure. Clamp 300 can include a plurality of inductive heaters 640, such as dedicated electrical lines (e.g., coils). The plurality of inductive heaters 640 can be embedded in clamp 300 and arranged in a patterned array and individually addressable. Each inductive heater 640 can be configured to define a unit field of clamp 300 to locally heat the unit field of clamp 300. As such, a desired heat flux distribution from clamp 300 to reticle can be realized. In some embodiments, the inductive heating effect can be enhanced by patterning electrical receiving structures to spatially modulate the heat flux distribution from clamp 300 to the backside of reticle 400.

It is noted that the number of inductive heaters 640, the sizes of inductive heaters 640, the gaps between adjacent inductive heaters 640, the shape of each inductive heater 640, and the patterned array of the plurality inductive heaters 640 that are shown in FIG. 11 are merely illustrative, but not limiting the scope of the present disclosure. Any suitable design of shape, size, pattern, and segment of inductive heaters 640 that enable various sub-fields heat flux modulation can be applied.

In some embodiments as shown in FIG. 11, trenches 500 (or holes 550) and inductive heaters 640 can be disposed in a same layer in clamp 300, and trenches 500 (or holes 550) can be disposed in gaps between adjacent inductive heaters 640. In some other embodiments, trenches 500 and/or holes 550 can be disposed in an upper layer of clamp 300, and inductive heaters 640 can be embedded in a lower layer of clamp 300. It is also noted that, a plurality of inductive heaters 640 can be disposed in separate module within the lithography system (e.g., reticle masking module) to spatially modulate heat flux to the front side of reticle 400.

As shown in FIG. 12, a schematic side view diagram of exemplary infrared heaters and a reticle is illustrated, according to some embodiments of the present disclosure. In some embodiments, the temperature conditioning system further includes a plurality of infrared heaters 640 configured to heat various portions of the front side of reticle 400 that receive less heat load from the lithography light beam. Each infrared heater 640 can be controlled to emit infrared ray (IR) beam to cover a unit field of reticle 400 to locally heat the unit field of reticle 400. Variance of the intensity distribution of the infrared light emitted by the plurality of infrared heaters 640 can realize a heat flux modulation on the front side of reticle 400. In some embodiments, the infrared heating effect can be enhanced by patterning an IR absorber layer 655 onto the front side of reticle 400 to facilitate spatially modulating the heating by the IR beam.

In some embodiments, a single infrared heater 640 can be controlled to heat different unit fields of reticle 400. For example, an infrared heater 640 can be controlled to move to another location to emit IR beam to heat another area. As another example, an infrared heater 640 can be controlled to rotate to emit IR beam to different directions. As yet another example, an optical aligning system can be used to direct the IR beam emitted form an infrared heater 640 to different directions. As such, the number of infrared heaters 640 can be reduced.

In some embodiments, the temperature conditioning system further includes a radiofrequency (RF) radiation heating sub-system (can be also referred as dielectric heating sub-system). FIG. 13 illustrates a schematic cross-sectional view diagram of an exemplary clamp including a plurality of electrodes that emit RF radiation, according to some embodiments of the present disclosure. Clamp 300 can include a plurality of electrodes 660 that are arranged in pattern (e.g., an array) and individually addressable. A high frequency electrical signal can be generated and superimposed onto a low-frequency electrostatic clamping voltage on electrodes 660, such that electrodes 600 can act as RF antennas and heat the backside of reticle 400. The RF radiation 665 of each electrode 630 can be configured to define a unit field of reticle 400 to locally heat the unit field of reticle 400. By controlling the frequency of RF radiation and the voltages on different electrodes 660, a modulation of the heat flux to the back side of reticle 400 can be realized.

It is noted that the number, size, shape and arrangement of electrodes 600 shown in FIG. 13 are merely illustrative, but not limiting the scope of the present disclosure. In some embodiments as shown in FIG. 13, trenches 500 (or holes 550) and electrodes 660 can be disposed in a same layer in clamp 300, and trenches 500 (or holes 550) can be disposed in gaps between adjacent electrodes 660. In some other embodiments, trenches 500 and/or holes 550 can be disposed in an upper layer of clamp 300, and electrodes 660 can be embedded in a lower layer of clamp 300. It is also noted that a plurality of electrodes 660 can be disposed in separate module within the lithography system (e.g., reticle masking module) to spatially modulate heat flux to the front side of reticle 400.

It is noted that one or more above described spatial heat flux modulation sub-systems, including the fluid flow temperature modulation sub-system, the thermoelectric temperature modulation sub-system, the heating wires, the inductive heaters, the infrared heaters, and the RF radiation heating sub-system, are optional. That is, any one of various combination of the above described sub-systems and/or devices can be included in the temperature conditioning system to modulate the spatial temperature distribution to the reticle.

Exemplary Methods for Reticle Spatial Temperature Distribution Control

As described above, the disclosed temperature conditioning system can spatially control the temperature distribution of a reticle (or mask) to reduce overlay error due to an uneven heat load on the reticle. It is noted that, the above described gas pressure modulations can also be used to correct the non-uniformities in the material of the reticle (or mask), thereby further reducing overlay error.

Referring to FIG. 14, a schematic diagram of an exemplary method for controlling a spatial temperature distribution of a reticle is illustrated in accordance with some embodiments of the present disclosure. It is noted that, a reticle is used as an example in the detailed description below of the disclosed method, while the disclosed method can also be used to control the spatial temperature distribution of a mask or other object.

The method can start at operation 1401, in which a spatial variation of coefficient of thermal expansion (CTE) temperature of zero-crossing (TZC) of a reticle that is disposed on a clamp can be determined. The spatial variation of coefficient of CTE TZC is usually inherent to the material manufacturing process of the reticle and may be unavoidable. The spatial variation in CTE TZC can mean that the optimal average temperature of the reticle varies spatially to minimize the reticle thermal stresses. In some embodiments, a CTE measurement can be performed by a separate system in advance of loading a reticle on a clamp to determine the spatial variation of coefficient of CTE TZC of the reticle. In another embodiment, data from previous exposures using the reticle in the lithography apparatus can be used to determine the optimal spatial variation of temperature across the reticle. In another embodiment, the reticle can be assumed to have a spatial variation of coefficient of CTE TZC that is substantially the same as other reticles fabricated by the same manufacturing process. The spatial variation of coefficient of CTE TZC of the reticle can be recorded in an array of elements that can be addressed corresponding to the spatial positions of unit fields of the reticle.

The method can proceed to operation 1403, in which a spatial non-uniform heat load distribution on the reticle can be determined. As described above in connection with FIGS. 4A-4E and 6, one or more sub-fields of the reticle that are exposed to the lithography radiation beam can result in a spatial non-uniform heat load distribution on the reticle. The spatial non-uniform heat load distribution on the reticle can be determined by using any suitable technique. For example, the spatial non-uniform heat load distribution on the reticle can be determined based on the detected positions of the exposed regions of the reticle under the lithography radiation beam. As another example, a temperature sensor array in the lithographic system can be used to remotely detect real-time spatial temperature distribution on the reticle.

The method can proceed to operation 1405, in which a spatial gas pressure distribution in a space between the reticle and the clamp can be modulated based on the spatial variation of coefficient of CTE TZC of the reticle and/or the spatial non-uniform heat load distribution on the reticle.

In some embodiments, the spatial gas pressure distribution in the space between the reticle and the clamp can be locally controlled to modulate the thermal conduction from the reticle backside, thereby reducing the local average temperature delta from the local CTE TZC of the reticle. The gas density in the space between the reticle and the clamp can be adjusted in magnitude to compensate the variation of the CTE TZC within the reticle. In some alternative embodiments, operation 1401 is omitted, and the spatial gas pressure distribution in the space between the reticle and the clamp is modulated based on the spatial non-uniform heat load distribution on the reticle.

In some embodiments, the spatial gas pressure distribution in the space between the reticle and the clamp can be modulated by individually controlling a gas flow through each of a plurality of gas distribution features on the clamp. As described above in connection with FIGS. 5A, 5B and 6, operation 1405 can include individually adjusting a gas flow rate through each of a subset of trenches and/or holes through controlling one or more valves. When a first sub-field of the reticle has a large heat load (e.g., being exposed under the lithography radiation beam), the subset of trenches and/or holes corresponding to the first sub-field can have a high gas flow rate to increase the gas pressure, such that the firs sub-field of reticle can have a high thermal conductivity to facilitate the cooling effect. The trenches and/or holes corresponding to a second sub-field that has a small heat load (e.g., being covered by a mask) can have a small or near-zero gas flow rate to decrease the gas pressure, such that the second sub-field of reticle can have a low thermal conductivity to suppress the cooling effect. In some embodiments, the trenches and/or holes corresponding to the boundary of the first sub-field and the second sub-field of the reticle can have a negative gas flow rate to vent to vacuum to create a sharp gas pressure transition and a steep step of the thermal conductivity at the boundary of different heat load on the reticle.

In some embodiments, operation 1405 can further include generating standing pressure waves to further modulate the spatial gas pressure distribution in the space between the reticle and the clamp. In some embodiments, the standing pressure waves can be generated in a gas reservoir or in gas ducts that are connected to the gas distribution features on the clamp, and can be either one-dimensional spatially distributed waves or two-dimensional spatially distributed waves. The standing pressure waves can be actuated by a single or small number of actuators by controlling vibration frequency to setup standing pressure waves with various wavelengths. The gas distribution features, such as trenches and/or holes leading up to the surface of the clamp can connect the generated standing pressure waves to the spatial gas pressure distribution in the space between the reticle and the clamp to further modulate the thermal conductivity.

The method can proceed to operation 1407, in which a spatial heat flux distribution to the reticle can be modulated based on the spatial variation of coefficient of CTE TZC of the reticle and/or the spatial non-uniform heat load distribution on the reticle.

In some embodiments, operation 1407 can include individually controlling a temperature and a fluid flow rate of a fluid flow passing through each of a plurality of sub-circuits of fluid channels embedded in the clamp to modulate a spatial temperature distribution of the clamp. As described above in connection with FIG. 8, the plurality of sub-circuits of fluid channels can be arranged in a patterned array, and each can locally control the temperature of a unit field of the clamp.

In some embodiments, operation 1407 can include individually controlling an intensity of an electric current through each of a plurality of thermoelectric devices to modulate a spatial temperature distribution of the clamp. As described above in connection with FIG. 9, the plurality of thermoelectric devices can be arranged in a patterned array, and each can locally control the temperature of a unit field of the clamp.

In some embodiments, operation 1407 can include individually controlling an intensity of an electric current through each of a plurality of sub-circuits of heating wires embedded in the clamp to modulate a spatial temperature distribution of the clamp. As described above in connection with FIG. 10, the plurality of sub-circuits of heating wires are arranged in a patterned array, and each can locally control the temperature of a unit field of the clamp.

In some embodiments, operation 1407 can include individually controlling an intensity of a magnetic field corresponding to each of a plurality of inductive heaters to modulate a spatial temperature distribution of the clamp. As described above in connection with FIG. 11, the plurality of inductive heaters are embedded in the clamp and arranged in a patterned array, and each can locally control the temperature of a unit field of the clamp.

In some embodiments, operation 1407 can include individually controlling a radiation position and an intensity of an infrared beam emitted from each of a plurality of infrared heaters on a frontside of the object to modulate a spatial temperature distribution of the object. As described above in connection with FIG. 12, each infrared beam emitted from an infrared heater can locally control the temperature of a unit field of the object.

In some embodiments, operation 1407 can include individually controlling each of a plurality of electrodes embedded in the clamp to act as a radiofrequency antenna to modulate a spatial temperature distribution of the object. As described above in connection with FIG. 13, the plurality of electrodes are arranged in a patterned array. A high frequency electrical signal can be generated and superimposed onto a low-frequency electrostatic voltage on each of the plurality of electrodes to locally control the temperature of a unit field of the object.

The operations of the disclosed method in various embodiments can be directly executed by a combination of any suitable hardware modules and software modules. The hardware modules can include any devices and components described above, and one or more hardware decoding processors in the lithography system, such as a microprocessor, a micro-controller, a central processing unit (CPU), a network processor (NP), a digital signal processor (DSP), an application specific integrated circuit (ASIC), a field-programmable gate array (FPGA), or other programmable logic device, discrete gate or transistor logic device, and discrete hardware components. The software module can include any suitable programs, instructions, and information that are related to the operations of the disclosed method, and may reside in any suitable storage/memory medium in the lithography system, such as a random access memory, a flash memory, a read-only memory, a programmable read-only memory, an electrically erasable programmable memory, a register, etc.

It should be noted that, in some implementations, the operations illustrated in the blocks of FIG. 14 can be executed or performed in any order or sequence not limited to the order and sequence shown and described in FIG. 14. Specifically, two consecutive blocks may actually be executed substantially simultaneously where appropriate or in parallel. For example, operation 1405 and 1407 can be executed substantially simultaneously to achieve a uniform temperature distribution on a reticle to minimize the overly error.

The embodiments may further be described using the following clauses:

1. An apparatus, comprising:
a clamp configured to fix an object, the clamp including a plurality of gas distribution features that are spatially arranged in a pattern; and
a gas pressure controller configured to individually control a gas flow rate through each of the plurality of gas distribution features to spatially modulate a gas pressure distribution in a space between the clamp and the object.

2. The apparatus of clause 1, wherein:
the gas distribution features include a plurality of trenches or holes arranged in an array form.

3. The apparatus of clause 2, wherein:
the gas distribution features are a plurality of trenches arranged in a patterned array of columns and rows;
the trenches in odd numbers of rows or in even numbers of columns are extended along a row direction; and
the trenches in even numbers of rows or in odd numbers of columns are extended along a column direction.

4. The apparatus of clause 1, further comprising:
a plurality of gas ducts configured to connect the gas distribution features to a gas supply system and a vacuum system; and a plurality of valves each configured to control a gas flow rate through a corresponding gas distribution feature.

5. The apparatus of clause 4, wherein:
the gas pressure controller is further configured to generate standing gas pressure waves in a subset of the plurality of gas ducts to further spatially modulate the gas pressure distribution in the space between the clamp and the object.

6. The apparatus of clause 4, wherein:
the plurality of valves are Piezo valves or micro-electromechanical system valves.

7. The apparatus of clause 1, further comprising:
a plurality of fluid channels embedded in the clamp and arranged in a patterned array, wherein each fluid channel forms a sub-circuit configured to pass a fluid flow to locally control a temperature of a corresponding region of the clamp.

8. The apparatus of clause 7, further comprising:
a temperature controller configured to individually control a temperature and a fluid flow rate of the fluid flow passing through each sub-circuit, thereby modulating a spatial temperature distribution of the clamp.

9. The apparatus of clause 1, further comprising:
a plurality of thermoelectric devices embedded in the clamp and arranged in an array form, wherein each of the plurality of thermoelectric devices is configured to locally control a temperature of a corresponding region of the clamp.

10. The apparatus of clause 9, wherein:
the plurality of thermoelectric devices include Peltier devices, thermionic cooling devices, or thermotunnel cooling devices.

11. The apparatus of clause 9, further comprising:
a temperature controller configured to individually control an intensity of an electric current through each thermoelectric device, thereby modulating a spatial temperature distribution of the clamp.

12. The apparatus of clause 1, further comprising:
a plurality of heating wires embedded in the clamp and arranged in a patterned array, wherein each heating wire forms a sub-circuit configured to locally heat a corresponding region of the clamp.

13. The apparatus of clause 12, further comprising:
a temperature controller configured to individually control an intensity of an electric current through each sub-circuit, thereby modulating a spatial temperature distribution of the clamp.

14. The apparatus of clause 1, further comprising:
a plurality of inductive heaters embedded in the clamp and arranged in a patterned array, wherein each inductive heater is configured to locally heat a corresponding region of the clamp.

15. The apparatus of clause 14, further comprising:
a temperature controller configured to individually control an intensity of a magnetic field corresponding to each inductive heater, thereby modulating a spatial temperature distribution of the clamp.

16. The apparatus of clause 1, further comprising:
a plurality of infrared heaters each configured to emit an infrared beam to a sub-field of a frontside of the object to locally heat the sub-field of the object.

17. The apparatus of clause 16, further comprising:
a temperature controller configured to individually control a position of each infrared heater, and an intensity and a direction of the infrared beam emitted from each infrared heater, thereby modulating a spatial temperature distribution of the object.

18. The apparatus of clause 16, further comprising:
an infrared light absorb layer on the frontside of the object.

19. The apparatus of clause 1, further comprising:
a plurality of electrodes embedded in the clamp and arranged in a patterned array, each electrode being configured to act as a radiofrequency antenna to locally heat a corresponding region of the object.

20. The apparatus of clause 19, further comprising:
a temperature controller configured to individually generate a high frequency electrical signal that is superimposed onto a low-frequency electrostatic voltage on each electrode, thereby modulating a spatial temperature distribution of the object.

21. The apparatus of clause 1, wherein:
the object is a reticle or a mask; and
a sub-field of the object is exposed under a lithography radiation beam, resulting in a spatial non-uniform heat load distribution on the object.

22. The apparatus of clause 1, further comprising:
a temperature sensor array configured to remotely detect a spatial temperature distribution on the object.

23. A method for modulating a spatial temperature distribution of an object fixed on a clamp, comprising:
determining a spatial non-uniform heat load distribution on the object; and
modulating a spatial gas pressure distribution in a space between the object and the clamp based on the spatial non-uniform heat load distribution.

24. The method of clause 23, further comprising:
determining a spatial variation of coefficient of thermal expansion (CTE) temperature of zero-crossing (TZC) of the object; and
modulating a spatial gas pressure distribution in a space between the object and the clamp based on the spatial variation of CTE TZC.

25. The method of clause 23, wherein the determining the spatial non-uniform heat load distribution on the object comprises:
determining a first sub-field of the object that is exposed under a lithography radiation beam, and a second sub-field of the object that is unexposed from the lithography radiation beam.

26. The method of clause 23, wherein the determining the spatial non-uniform heat load distribution on the object comprises:
using a temperature sensor array to remotely detect a spatial temperature distribution on the object.

27. The method of clause 25, wherein the modulating the spatial gas pressure distribution comprises:
generating a high gas flow rate in a first subset of a plurality of gas distribution features in the clamp corresponding to the first sub-field of the object to form a high gas pressure corresponding to the first sub-field is high; and
generating a low gas flow rate in a second subset of the plurality of gas distribution features in the clamp corresponding to the second sub-field of the object to form a low gas pressure corresponding to the second sub-field.

28. The method of clause 27, wherein the modulating the spatial gas pressure distribution further comprises:
generating a negative gas flow rate in a third subset of the plurality of gas distribution features in the clamp corresponding to a boundary of the first sub-field and the second sub-field of the object to form a sharp gas pressure transition corresponding to the boundary.

29. The method of clause 27, wherein the modulating the spatial gas pressure distribution further comprises:
generating a standing gas pressure wave in at least one gas duct connected to the first subset of a plurality of gas distribution features.

30. The method of clause 27, further comprising:
modulating a spatial heat flux distribution to the object based on the spatial non-uniform heat load distribution.

31. The method of clause 30, wherein:
the modulating the spatial heat flux distribution comprises individually controlling a temperature and a fluid flow rate of a fluid flow passing through each of a plurality of sub-circuits of fluid channels embedded in the clamp to modulate a spatial temperature distribution of the clamp, and the plurality of sub-circuits of fluid channels are arranged in a patterned array.

32. The method of clause 30, wherein modulating the spatial heat flux distribution comprises: individually controlling an intensity of an electric current through each of a plurality of thermoelectric devices to modulate a spatial temperature distribution of the clamp, wherein the plurality of thermoelectric devices are arranged in a patterned array.

33. The method of clause 30, wherein:
the modulating the spatial heat flux distribution comprises individually controlling an intensity of an electric current through each of a plurality of sub-circuits of heating wires embedded in the clamp to modulate a spatial temperature distribution of the clamp, and the plurality of sub-circuits of heating wires are arranged in a patterned array.

34. The method of clause 30, wherein:
the modulating the spatial heat flux distribution comprises individually controlling an intensity of a magnetic field corresponding to each of a plurality of inductive heaters to modulate a spatial temperature distribution of the clamp, and the plurality of inductive heaters are arranged in a patterned array.

35. The method of clause 30, wherein the modulating the spatial heat flux distribution comprises:
individually controlling a radiation position and an intensity of an infrared beam emitted from each of a plurality of infrared heaters on a frontside of the object to modulate a spatial temperature distribution of the object.

36. The method of clause 30, wherein:
the modulating the spatial heat flux distribution comprises individually controlling each of a plurality of electrodes embedded in the clamp to act as a radiofrequency antenna to modulate a spatial temperature distribution of the object, and the plurality of electrodes are arranged in a patterned array.

37. The method of clause 36, further comprising:
generating a high frequency electrical signal that is superimposed onto a low-frequency electrostatic voltage on each of the plurality of electrodes.

Final Remarks

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference may be made in this text to embodiments of the disclosure in the context of a lithographic apparatus, embodiments of the disclosure may be used in other apparatuses. Embodiments of the disclosure may form part of a mask inspection apparatus, a metrology apparatus, or any apparatus that measures or processes an object such as a wafer (or other substrate) or mask (or other patterning device). These apparatuses may be generally referred to as lithographic tools. Such lithographic tools may use vacuum conditions or ambient (non-vacuum) conditions.

Although specific reference may have been made above to the use of embodiments of the disclosure in the context of optical lithography, it will be appreciated that the disclosure, where the context allows, is not limited to optical lithography and may be used in other applications, for example imprint lithography.

It is to be understood that the phraseology or terminology herein is for the purpose of description and not of limitation, such that the terminology or phraseology of the present specification is to be interpreted by those skilled in relevant art(s) in light of the teachings herein.

The above examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific embodiments of the disclosure have been described above, it will be appreciated that the disclosure may be practiced otherwise than as described. The descriptions above are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. An apparatus, comprising:
a clamp configured to fix an object, the clamp including a plurality of gas distribution features that are spatially arranged in a pattern;
a plurality of heating devices embedded in the clamp and arranged in a patterned array, wherein each of the plurality of heating devices is configured to locally heat the clamp; and a gas pressure controller configured to individually control a gas flow rate through each of the plurality of gas distribution features to spatially modulate a gas pressure distribution in a space between the clamp and the object.

2. The apparatus of claim 1, wherein:
the gas distribution features include a plurality of trenches or holes arranged in an array form.

3. The apparatus of claim 2, wherein:
the gas distribution features are a plurality of trenches arranged in a patterned array of columns and rows;
the trenches in odd numbers of rows or in even numbers of columns are extended along a row direction; and
the trenches in even numbers of rows or in odd numbers of columns are extended along a column direction.

4. The apparatus of claim 1, further comprising:
a plurality of gas ducts configured to connect the gas distribution features to a gas supply system and a vacuum system; and
a plurality of valves each configured to control a gas flow rate through a corresponding gas distribution feature.

5. The apparatus of claim 4, wherein:
the gas pressure controller is further configured to generate standing gas pressure waves in a subset of the plurality of gas ducts to further spatially modulate the gas pressure distribution in the space between the clamp and the object.

6. The apparatus of claim 4, wherein:
the plurality of valves are Piezo valves or micro-electromechanical system valves.

7. The apparatus of claim 1, further comprising:
a plurality of fluid channels embedded in the clamp and arranged in a patterned array, wherein each fluid channel forms a sub-circuit configured to pass a fluid flow to locally control a temperature of a corresponding region of the clamp.

8. The apparatus of claim 7, further comprising:
a temperature controller configured to individually control a temperature and a fluid flow rate of the fluid flow passing through each sub-circuit, thereby modulating a spatial temperature distribution of the clamp.

9. The apparatus of claim 1, further comprising:
a plurality of thermoelectric devices embedded in the clamp and arranged in an array form,
wherein each of the plurality of thermoelectric devices is configured to locally control a temperature of a corresponding region of the clamp.

10. The apparatus of claim 9, wherein:
the plurality of thermoelectric devices includes Peltier devices, thermionic cooling devices, or thermotunnel cooling devices.

11. The apparatus of claim 9, further comprising:
a temperature controller configured to individually control an intensity of an electric current through each thermoelectric device, thereby modulating a spatial temperature distribution of the clamp.

12. The apparatus of claim 1, wherein:
the plurality of heating devices comprises a plurality of heating wires, and
each of the plurality of heating wires forms a sub-circuit configured to locally heat a corresponding region of the clamp.

13. The apparatus of claim 12, further comprising:
a temperature controller configured to individually control an intensity of an electric current through each sub-circuit, thereby modulating a spatial temperature distribution of the clamp.

14. The apparatus of claim 1, wherein:
the plurality of heating devices comprises a plurality of inductive heaters embedded in the clamp and arranged in a patterned array,
each of the plurality of inductive heaters is configured to locally heat a corresponding region of the clamp.

15. The apparatus of claim 14, further comprising:
a temperature controller configured to individually control an intensity of a magnetic field corresponding to each inductive heater, thereby modulating a spatial temperature distribution of the clamp.

16. The apparatus of claim 1, wherein:
the plurality of heating devices comprises a plurality of infrared heaters, and
each of the plurality of heating devices is configured to emit an infrared beam to a sub-field of a frontside of the object to locally heat the sub-field of the object.

17. The apparatus of claim 16, further comprising:
a temperature controller configured to individually control a position of each infrared heater, and an intensity and a direction of the infrared beam emitted from each infrared heater, thereby modulating a spatial temperature distribution of the object.

18. The apparatus of claim 16, further comprising:
an infrared light absorb layer on the frontside of the object.

19. The apparatus of claim 1, further comprising:
a plurality of electrodes embedded in the clamp and arranged in a patterned array, each electrode being configured to act as a radiofrequency antenna to locally heat a corresponding region of the object.

20. The apparatus of claim 19, further comprising:
a temperature controller configured to individually generate a high frequency electrical signal that is superimposed onto a low-frequency electrostatic voltage on each electrode, thereby modulating a spatial temperature distribution of the object.

* * * * *